(12) United States Patent
Borges et al.

(10) Patent No.: US 6,956,250 B2
(45) Date of Patent: *Oct. 18, 2005

(54) GALLIUM NITRIDE MATERIALS INCLUDING THERMALLY CONDUCTIVE REGIONS

(75) Inventors: Ricardo Borges, Morrisville, NC (US);
Kevin J. Linthicum, Angier, NC (US);
T. Warren Weeks, Raleigh, NC (US);
Thomas Gehrke, Apex, NC (US)

(73) Assignee: Nitronex Corporation, Raleigh, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 09/792,409

(22) Filed: Feb. 23, 2001

(65) Prior Publication Data

US 2002/0117695 A1 Aug. 29, 2002

(51) Int. Cl.⁷ ............................................. H01L 31/0328
(52) U.S. Cl. ..................... 257/189; 257/190; 257/191; 257/103; 257/615
(58) Field of Search ................................ 257/276, 279, 257/103, 197, 76, 94, 96, 95, 98–99, 66, 11, 78, 189, 289, 425, 615, 631, 190–191; 438/214, 280, 411, 619

(56) References Cited

U.S. PATENT DOCUMENTS

| | | | |
|---|---|---|---|
| 4,842,699 A | | 6/1989 | Hua et al. |
| 4,910,583 A | | 3/1990 | Behr et al. |
| 5,122,845 A | | 6/1992 | Manabe et al. |
| 5,192,987 A | | 3/1993 | Khan et al. |
| 5,200,641 A | | 4/1993 | Kosaki |
| 5,239,188 A | * | 8/1993 | Takeuchi et al. ............... 257/76 |
| 5,296,395 A | | 3/1994 | Khan et al. |
| 5,389,571 A | | 2/1995 | Takeuchi et al. |

(Continued)

FOREIGN PATENT DOCUMENTS

| | | |
|---|---|---|
| EP | 0 079 265 | 5/1983 |
| EP | 0 852 416 A1 | 7/1998 |
| EP | 0 951 055 A2 | 10/1999 |
| JP | 59163865 | 9/1994 |
| JP | 10189800 | 7/1998 |
| WO | WO 00/33365 A1 | 6/2000 |
| WO | WO 01/37327 A1 | 5/2001 |
| WO | WO 01/43174 A2 | 6/2001 |
| WO | WO 01/47002 A2 | 6/2001 |
| WO | WO 01/59819 A1 | 8/2001 |

OTHER PUBLICATIONS

Ishikawa, H. et al., "High–Quality GaN on Si Substrate Using AlGaN/AlN Intermediate Layer," *Phys. Stat. Sol. (a)* 176, pp. 599–603 (1999).

Primary Examiner—Long Pham
Assistant Examiner—Thao X Le
(74) Attorney, Agent, or Firm—Wolf, Greenfield & Sacks, P.C.

(57) ABSTRACT

The invention includes providing gallium nitride materials including thermally conductive regions and methods to form such materials. The gallium nitride materials may be used to form semiconductor devices. The thermally conductive regions may include heat spreading layers and heat sinks. Heat spreading layers distribute heat generated during device operation over relatively large areas to prevent excessive localized heating. Heat sinks typically are formed at either the backside or topside of the device and facilitate heat dissipation to the environment. It may be preferable for devices to include a heat spreading layer which is connected to a heat sink at the backside of the device. A variety of semiconductor devices may utilize features of the invention including devices on silicon substrates and devices which generate large amounts of heat such as power transistors.

74 Claims, 10 Drawing Sheets

U.S. PATENT DOCUMENTS

| | | |
|---|---|---|
| 5,393,993 A | 2/1995 | Edmond et al. |
| 5,438,212 A * | 8/1995 | Okaniwa .................... 257/275 |
| 5,449,930 A * | 9/1995 | Zhou ......................... 257/197 |
| 5,523,589 A | 6/1996 | Edmond et al. |
| 5,739,554 A * | 4/1998 | Edmond et al. ............ 257/103 |
| 5,741,724 A | 4/1998 | Ramdani et al. |
| 5,760,426 A | 6/1998 | Marx et al. |
| 5,838,706 A | 11/1998 | Edmond et al. |
| 5,874,747 A | 2/1999 | Redwing et al. |
| 5,905,275 A * | 5/1999 | Nunoue et al. ............... 257/95 |
| 6,051,849 A | 4/2000 | Davis et al. |
| 6,060,331 A | 5/2000 | Shakouri et al. |
| 6,069,394 A * | 5/2000 | Hashimoto et al. ......... 257/466 |
| 6,121,121 A * | 9/2000 | Koide ........................ 438/481 |
| 6,153,010 A | 11/2000 | Kiyoku et al. |
| 6,177,688 B1 | 1/2001 | Linthicum et al. |
| 6,201,262 B1 | 3/2001 | Edmond et al. |
| 6,255,198 B1 | 7/2001 | Linthicum et al. |
| 6,261,929 B1 | 7/2001 | Gehrke et al. |
| 6,265,289 B1 | 7/2001 | Zheleva et al. |
| 6,355,497 B1 * | 3/2002 | Romano et al. ............. 438/39 |
| 6,380,108 B1 | 4/2002 | Linthicum et al. |
| 6,403,451 B1 | 6/2002 | Linthicum et al. |
| 6,426,512 B1 | 7/2002 | Ito et al. |
| 6,441,393 B2 | 8/2002 | Goetz et al. |
| 6,486,502 B1 | 11/2002 | Sheppard et al. |
| 6,489,636 B1 * | 12/2002 | Goetz et al. .................. 257/94 |
| 6,586,781 B2 | 7/2003 | Wu et al. |
| 6,611,002 B2 | 8/2003 | Weeks et al. |
| 6,617,060 B2 * | 9/2003 | Weeks et al. ............... 428/698 |
| 6,649,287 B2 * | 11/2003 | Weeks et al. ............... 428/698 |
| 2001/0000733 A1 * | 5/2001 | Tomioka ........................ 427/8 |
| 2001/0002048 A1 * | 5/2001 | Koite et al. .................... 257/80 |
| 2001/0008656 A1 * | 7/2001 | Tischler et al. ............. 428/34.1 |
| 2001/0040245 A1 * | 11/2001 | Kawai ........................ 257/192 |
| 2001/0040247 A1 * | 11/2001 | Ando et al. .................. 257/192 |
| 2002/0020341 A1 | 2/2002 | Marchand et al. |
| 2002/0030195 A1 * | 3/2002 | Yoshii et al. ................ 257/101 |
| 2002/0074552 A1 | 6/2002 | Weeks, Jr., et al |
| 2002/0098693 A1 | 7/2002 | Kong et al. |
| 2002/0117681 A1 * | 8/2002 | Weeks et al. ................ 257/106 |

* cited by examiner

GALLIUM NITRIDE MATERIALS INCLUDING THERMALLY CONDUCTIVE REGIONS

FIELD OF INVENTION

The invention relates generally to semiconductor materials and, more particularly, to gallium nitride materials and methods of producing gallium nitride materials.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many semiconductor device applications such as transistors, field emitters, and optoelectronic devices.

Gallium nitride materials have been formed on a number of different substrates including silicon carbide (SiC), sapphire, and silicon. Device structures, such as doped regions, may then be formed within the gallium nitride material region. In certain device applications, heat is generated as a result of resistance to current flow within the device. In particular, active device areas and/or highly resistive regions may generate large amounts of localized heat. The excessive heat may damage the device or cause performance problems. Therefore, it is desirable to distribute and/or dissipate heat generated within the device.

Certain substrates, such as SiC, are relatively good thermal conductors which can facilitate heat distribution and/or dissipation during device operation. However, silicon only moderately conducts heat. Therefore, heat generally is not efficiently distributed or dissipated through silicon substrates.

SUMMARY OF INVENTION

The invention includes providing gallium nitride materials including thermally conductive regions and methods to form such materials. The gallium nitride materials may be used to form semiconductor devices. The thermally conductive regions may include heat spreading layers and heat sinks. Heat spreading layers distribute heat generated during device operation over relatively large areas to prevent excessive localized heating. Heat sinks typically are formed at either the backside or topside of the device and facilitate heat dissipation to the environment. It may be preferable for devices to include a heat spreading layer which is connected to a heat sink at the backside of the device. A variety of semiconductor devices may utilize features of the invention including devices on silicon substrates and devices which generate large amounts of heat such as power transistors.

In one aspect, the invention provides a semiconductor structure. The semiconductor structure includes a substrate and a gallium nitride material region formed over the substrate. The semiconductor structure further includes a heat spreading layer formed over the substrate. The heat spreading layer has a greater thermal conductivity than that of the gallium nitride material region. The semiconductor structure further includes a heat sink formed in the semiconductor structure.

In another aspect, the invention provides a semiconductor structure. The semiconductor structure includes a substrate and a gallium nitride material region formed over the substrate. A semiconductor device is formed, at least in part, in the gallium nitride material region. The semiconductor structure includes a heat spreading layer formed over the substrate. The heat spreading layer has a greater thermal conductivity than that of each of the gallium nitride material region and the substrate.

In another aspect, the invention provides a semiconductor structure. The semiconductor structure includes a substrate and a gallium nitride material region formed over the substrate. A heat sink extends from a surface of the semiconductor structure.

In another aspect, the invention provides a semiconductor structure. The semiconductor structure includes a silicon substrate and a gallium nitride material region formed over the substrate. A semiconductor device is formed, at least in part, in the gallium nitride material region. The semiconductor structure further includes a thermal region capable of distributing and dissipating heat generated by the device.

In another aspect, the invention provides a method of forming a semiconductor structure. The method includes forming a heat spreading layer over a substrate, forming a gallium nitride material region over the substrate, and forming a heat sink in the semiconductor structure. The heat spreading layer has a greater thermal conductivity than that of the gallium nitride material region.

In another aspect, the invention provides a method of forming a semiconductor structure. The method includes forming a heat spreading layer over a substrate, and forming a gallium nitride material region over the substrate. The heat spreading layer has a greater thermal conductivity than that of both the gallium nitride material region and the substrate.

In another aspect, the invention provides a method of forming a semiconductor structure. The method includes forming a gallium nitride material region over a substrate, and forming a heat sink extending from a surface of the semiconductor structure.

Among other advantages, the invention provides a mechanism for effectively distributing and/or dissipating heat in gallium nitride material devices. The devices, thus, can operate under conditions which generate amounts of heat that would otherwise result in damage and/or performance problems.

The invention also enables heat distribution and dissipation in gallium nitride devices formed on substrates, such as silicon, which are poor or moderate thermal conductors. Despite its poor thermal conductivity, it may be advantageous to form devices on silicon substrates due to other advantages associated with silicon substrates including availability, cost, size, and ease of processing.

In other embodiments, the invention provides a mechanism for effectively adding heat to gallium nitride material devices, for example, to maintain a substantially constant temperature of the device which may be desired in certain applications.

It should be understood that not every embodiment of the invention has all of the advantages described herein. Other advantages, aspects, and features of the invention will become apparent from the following detailed description of the invention when considered in conjunction with the accompanying drawings.

DETAILED DESCRIPTION OF INVENTION

The invention provides gallium nitride material devices including thermally conductive regions and methods to form such devices.

Figure 1:
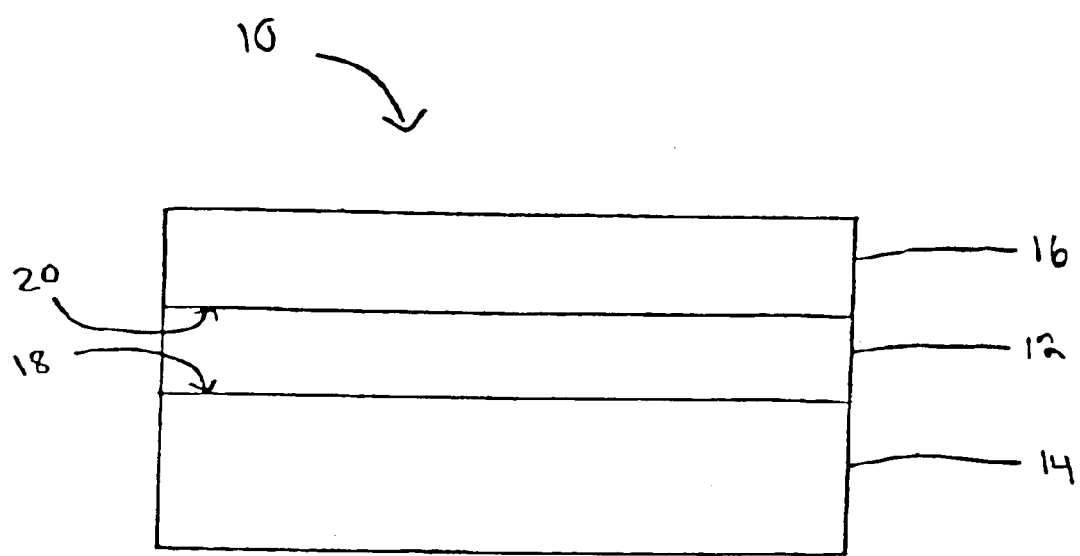
FIG. 1 illustrates a gallium nitride material device including a heat spreading layer connected to a heat sink according to one embodiment of the present invention.
Figure 2A:
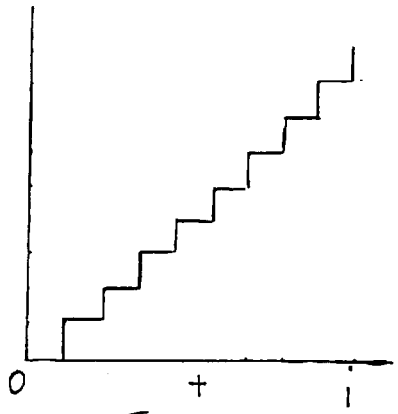
FIG. 2 illustrates a gallium nitride material device including a heat sink that extends through the heat spreading layer according to one embodiment of the present invention.
Figure 2B:
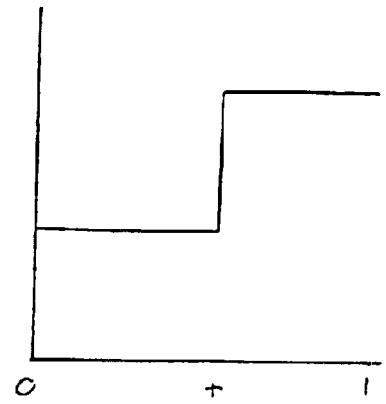
Figure 2C:
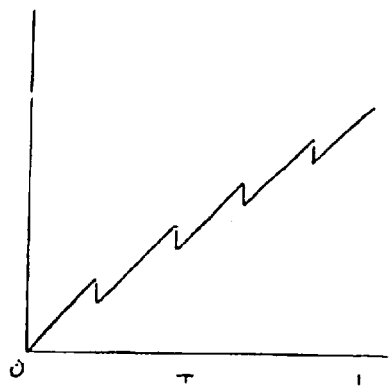
Figure 2D:
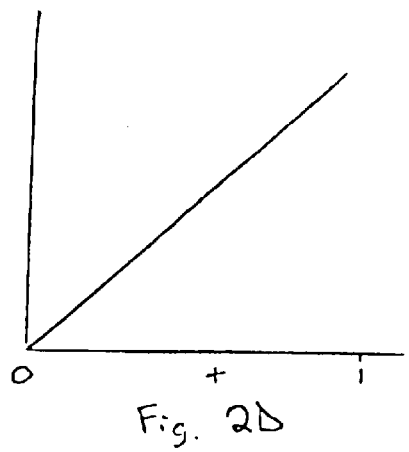
Figure 2E:
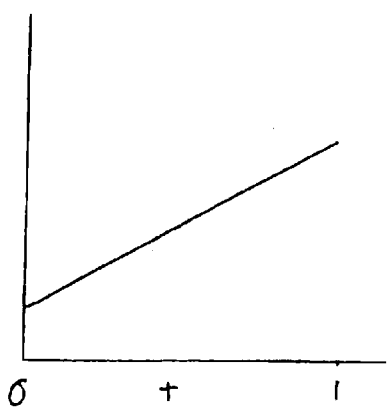
Figure 2F:
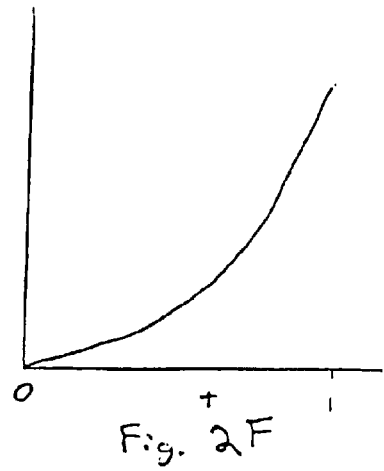
Figure 2G:
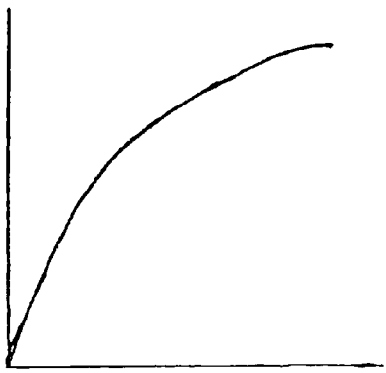
Figure 2H:
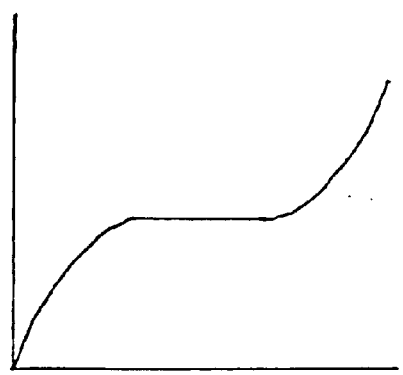
Figure 2I:
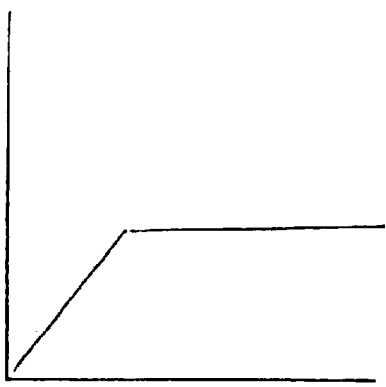
Figure 3A:
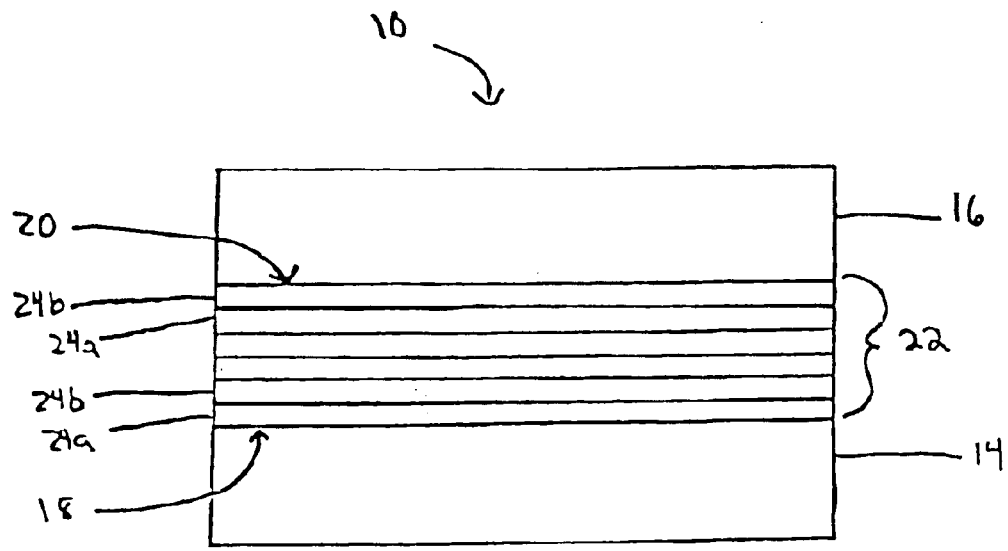
FIG. 3 illustrates a gallium nitride material device including a heat sink formed from conductive material deposited within a via that extends from a backside of a device according to one embodiment of the present invention.
Figure 3B:
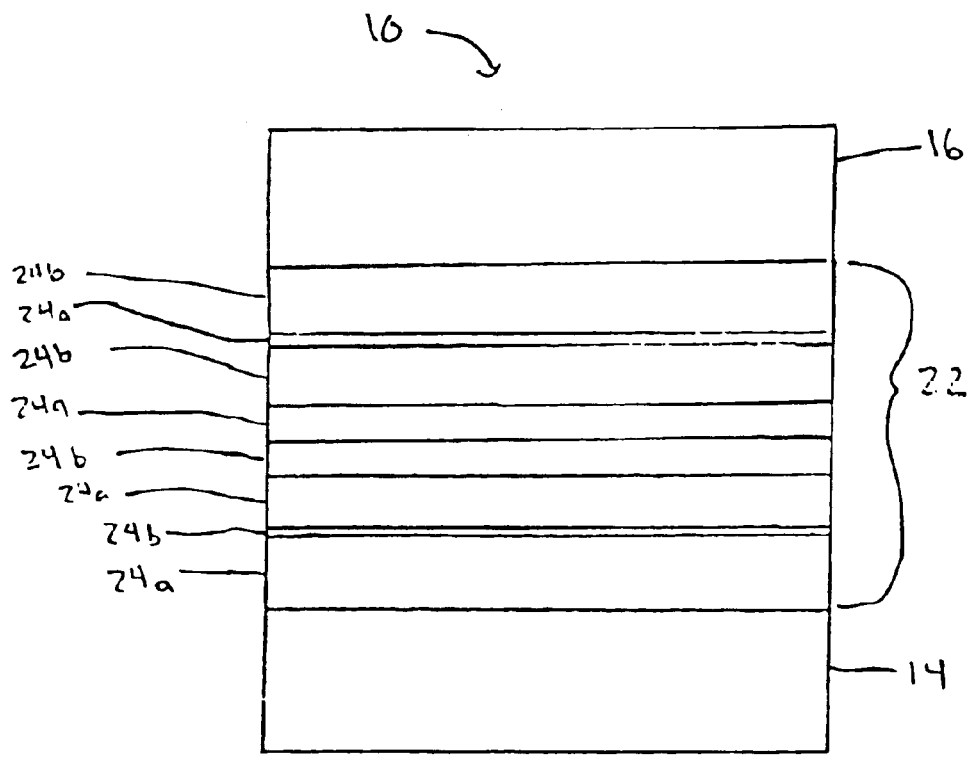
Figure 4A:
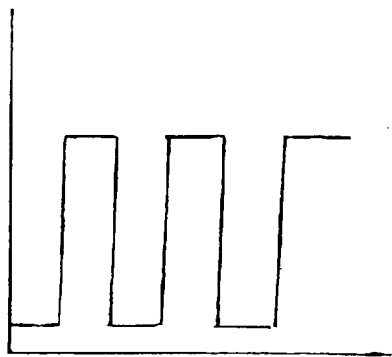
FIG. 4 illustrates a gallium nitride material device including a heat sink with an interface layer according to one embodiment of the present invention.
Figure 4B:
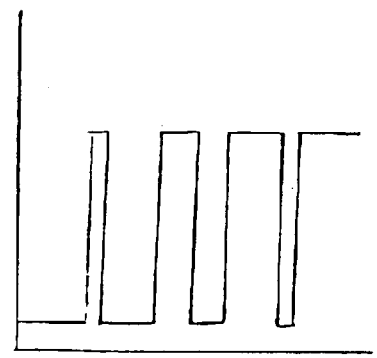

Referring to FIG. 1, a semiconductor device 10 according to one embodiment of the invention is shown. Device 10 includes a gallium nitride material device region 12 formed over a substrate 14. As described further below, device structures are typically formed, at least in part, within gallium nitride material device region 12. A heat spreading layer 16 is formed between gallium nitride material region 12 and substrate 14. Heat spreading layer 16 distributes heat generated within device region 12 which otherwise may damage the device or effect performance. In the illustrative embodiment, device 10 also includes a heat sink 18 that extends from a backside 20 of the device. As shown, heat sink 18 is connected to spreading layer 16 so that heat conducted from the spreading layer may be dissipated, for example to the environment, by the heat sink.

It should be understood that when a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate. As referred to herein, the term "backside" refers to the bottom surface of the device and the term "topside" refers to the upper surface of the device. Thus, the topside is opposite the backside of the device.

Heat spreading layer 16 conducts heat away from device region 12. In particular, spreading layer 16 conducts heat away from areas within device region 12 which generate large amounts of heat such as active device areas and/or highly resistive areas (i.e., hot spots). As described further below, spreading layer 16 is preferably designed to conduct heat sufficiently to prevent excessive localized heating which otherwise would result in damage and/or effect performance of device 10. Such damage can include structural and/or chemical damage which can degrade electronic properties of the device such as the breakdown voltage and carrier mobility.

Heat is distributed throughout the volume of spreading layer 16. Because the surface area of spreading layer 16 is typically much greater than its thickness, heat is primarily distributed over the surface area of the spreading layer. Thus, the spreading layer generally functions to distribute heat laterally over device 10.

Heat spreading layer 16 may be formed of any suitable material that has sufficient thermal conductive properties. Generally, heat spreading layer 16 has a higher thermal conductivity than that of gallium nitride material device region 12. In some preferred embodiments, such as when a silicon substrate 14 is utilized, heat spreading layer 16 also has a higher thermal conductivity than that of substrate 14. Heat spreading layer 16, for example, has a thermal conductivity of greater than or equal to about 1.7 W/m$^2$·K. In other cases, when a greater conductivity is required, spreading layer 16 may have a thermal conductivity of greater than or equal to about 2.5 W/m$^2$·K. In still other cases, when greater conductivities are desired, spreading layer 16 may have a thermal conductivity of greater than or equal to about 4.5 W/m$^2$·K. Examples of suitable materials for heat spreading layer 16 include, but are not limited to, silicon carbide (SiC); alloys of silicon carbide and aluminum nitride (AlN$_x$SiC$_{(1-x)}$); and Group III nitrides including aluminum nitride (AlN), boron nitride (BN), and aluminum gallium nitride alloys having greater than 0.5 mole fraction of aluminum (e.g., Al$_x$Ga$_{(1-x)}$N, wherein x>0.5). It should be understood that the heat spreading layer may also be made of other materials having sufficient thermal conductive properties. Aluminum nitride (AlN) heat spreading layers may be particularly preferred in some embodiments, for example, because of their ability to have other functions within device 10 such as buffer layers.

In some embodiments, heat spreading layer 16 has a constant composition throughout its thickness (t). In other embodiments, heat spreading layer 16 has a composition that varies across at least a portion of its thickness. For example, heat spreading layer 16 may include more than one layer having separate compositions. Also, heat spreading layer 16 may be a portion of a compositionally-graded transition layer formed between substrate 14 and gallium nitride material region 12. Compositionally-graded transition layers have been described in copending, commonly-owned, U.S. patent application Ser. No. 09/736,972, entitled "Gallium Nitride Materials and Methods," filed on Dec. 14, 2000, which is incorporated herein by reference. Compositionally-graded transition layers also are effective in reducing crack formation in gallium nitride material device region 12 by lowering thermal stresses that result from differences in thermal expansion rates between the gallium nitride material and substrate 14 (e.g., silicon). In some embodiments, spreading layer 16 is a portion of a compositionally-graded transition layer composed of an alloy of aluminum gallium nitride (e.g., $Al_xGa_{(1-x)}N$ or $Al_xIn_yGa_{(1-x-y)}N$) having greater than 0.5 mole fraction of aluminum ($Al_xGa_{(1-x)}N$, x>0.5).

The dimensions of heat spreading layer 16 depend in part upon the requirements for the particular application. Generally, heat spreading layer 16 has a thickness (t) of between about 5 nm and about 5 microns, though other dimensions also are possible. In some embodiments, relative thick (e.g., between about 100 nm and about 5 micron) heat spreading layers may be preferred to provide larger volumes which increase the amount of heat that may be distributed in the layer. In other cases, relatively thin (e.g., between about 5 nm and about 50 nm) heat spreading layers may be preferred to reduce lattice related stresses which may increase mechanical reliability during use.

Figure 2:
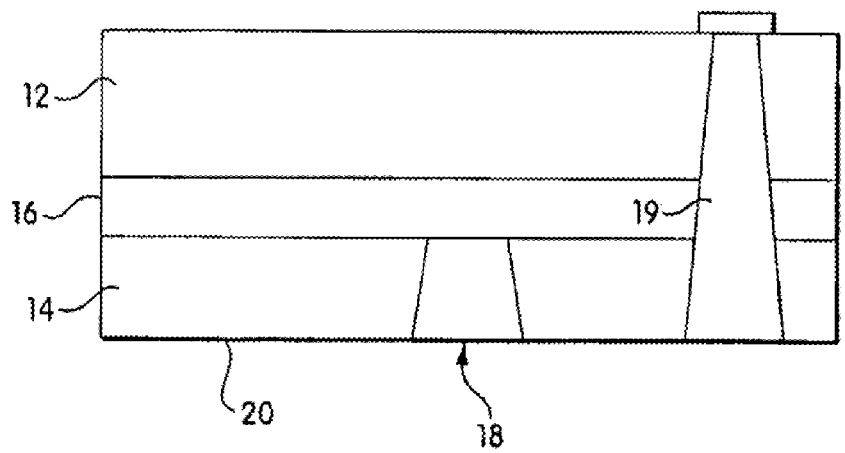

In the embodiment of FIG. 1, heat spreading layer 16 extends over the entire surface area of substrate 14. In many cases, for example to maximize heat distribution over device 10, it is preferable to have heat spreading layer 16 extend over the entire surface area of substrate 14. In other cases, heat spreading layer 16 may extend over only a portion of the entire surface area of substrate 14. As shown in FIG. 2, one or more electrical contacts 19 may extend through heat spreading layer 16 to provide electrical conduction therethrough. In other embodiments (not shown) heat spreading layer 16 may only be formed proximate areas which generate excessive amounts of heat (e.g., device regions, or highly resistive regions).

Figure 9:
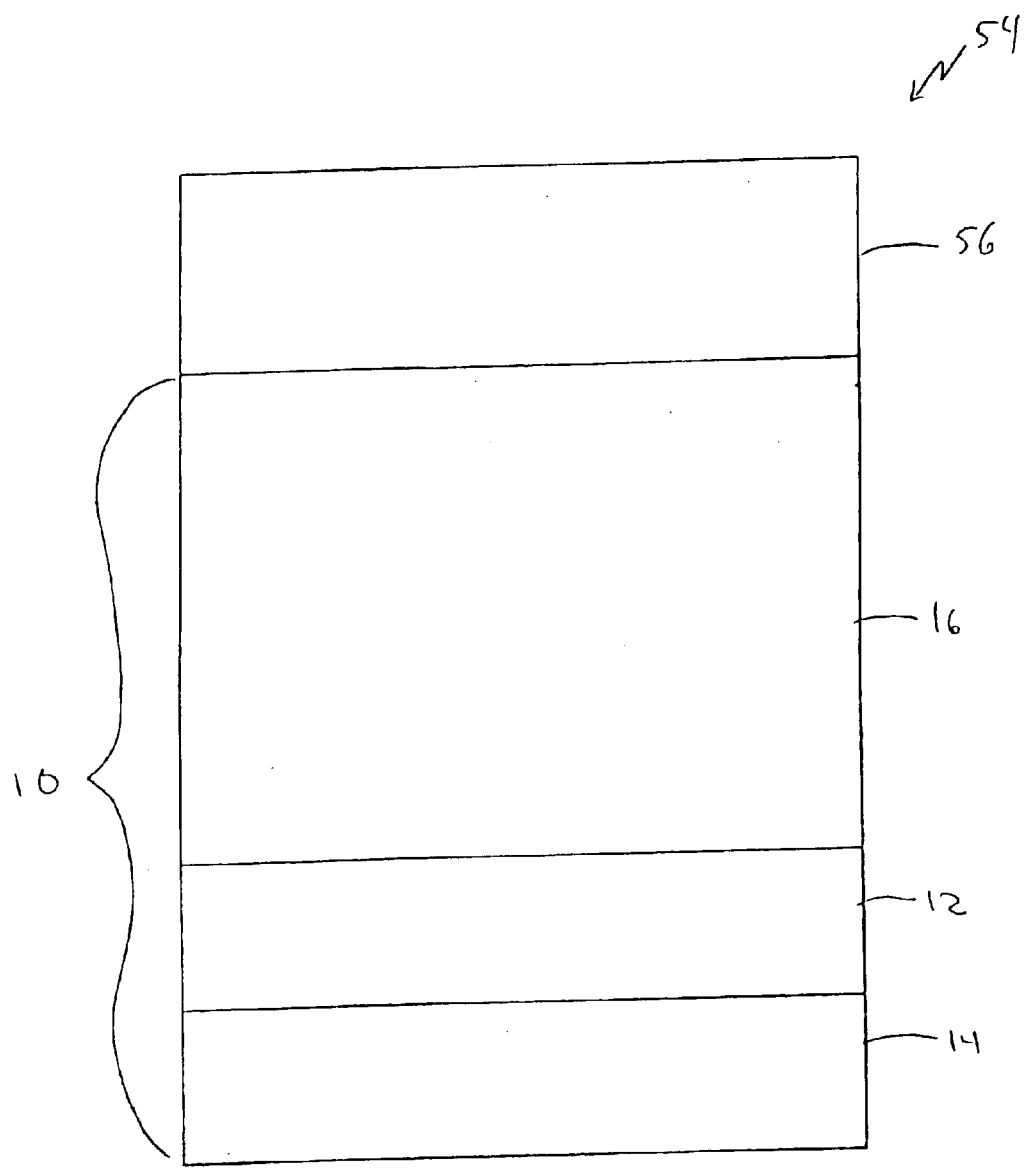
FIG. 9 illustrates a gallium nitride material device that includes a heat sink that extends from a topside of the device according to one embodiment of the present invention.

As shown in FIG. 1, heat spreading layer 16 is connected to heat sink 18 to permit conduction from the spreading layer to the heat sink. In the illustrative embodiment, heat sink 18 is positioned at backside 20 to increase dissipation of heat, for example, to the environment. In other cases, heat sink 18 may be positioned at a topside surface of the device (as shown in FIG. 9). In some cases, heat sink 18 is most effective when located proximate regions which generate large amounts of heat. It should also be understood that more than one heat sink may be utilized in the same device 10.

Figure 5:
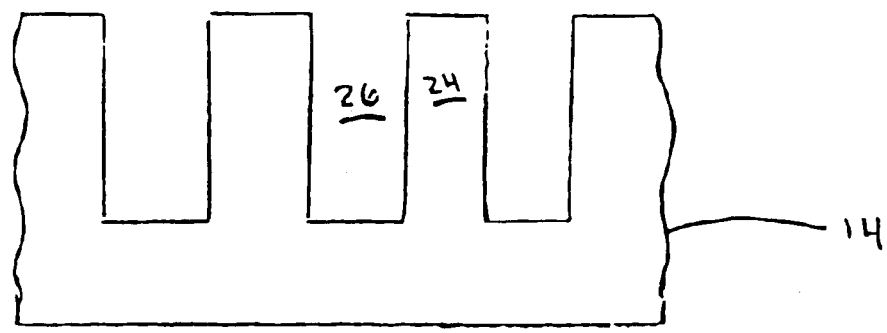
FIG. 5 is a side view of a gallium nitride material device including a heat sink channel that extends laterally across the device according to one embodiment of the present invention.
Figure 3:
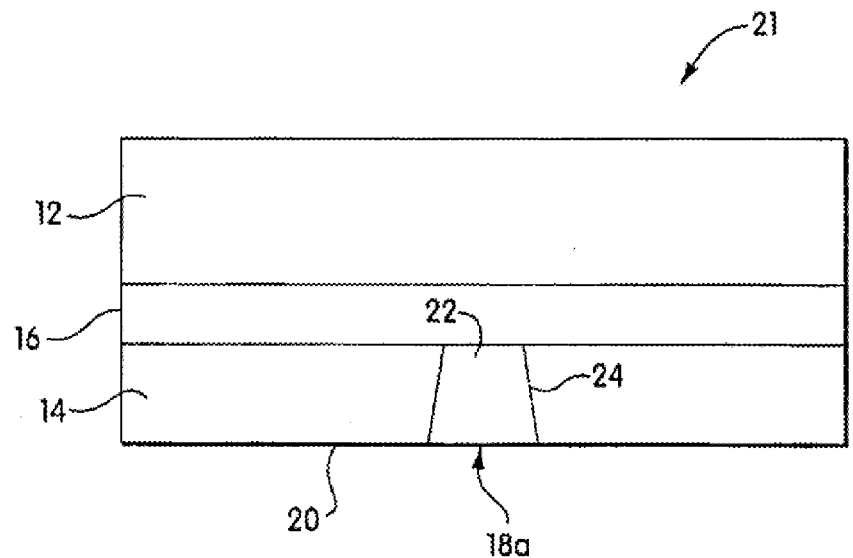
Figure 4:
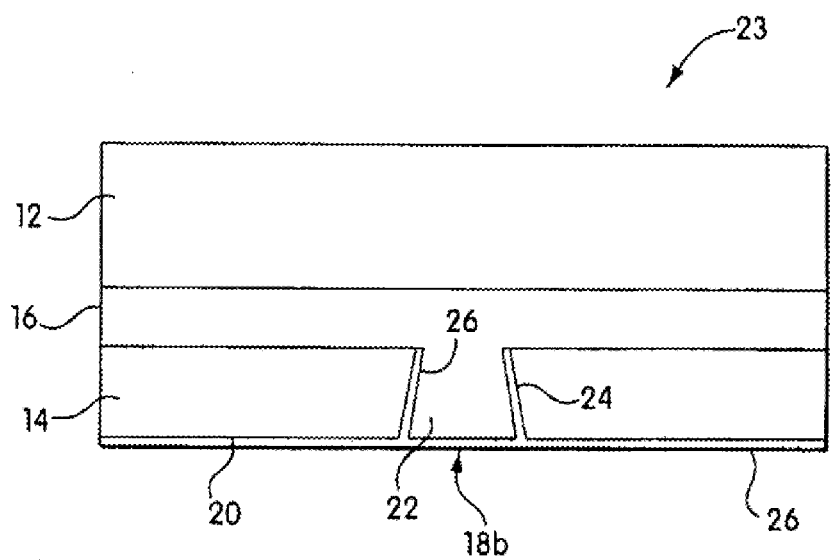
Figure 5:
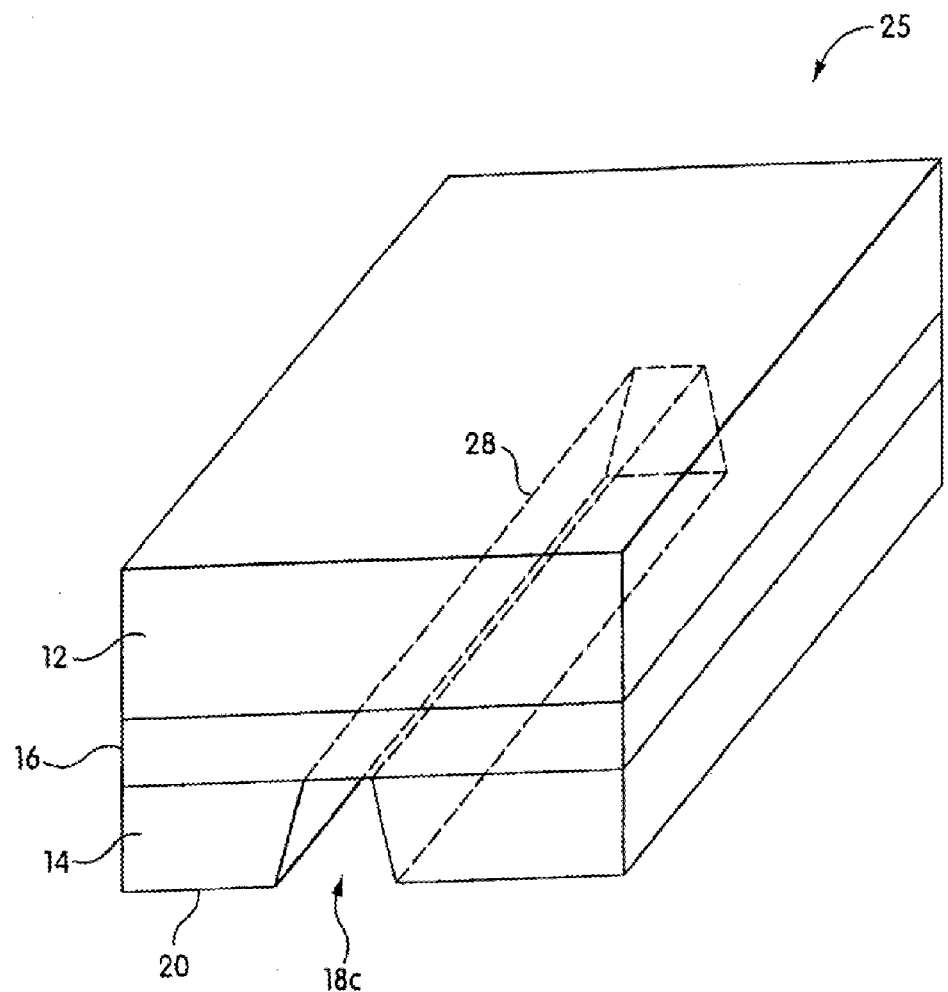
Figure 6:
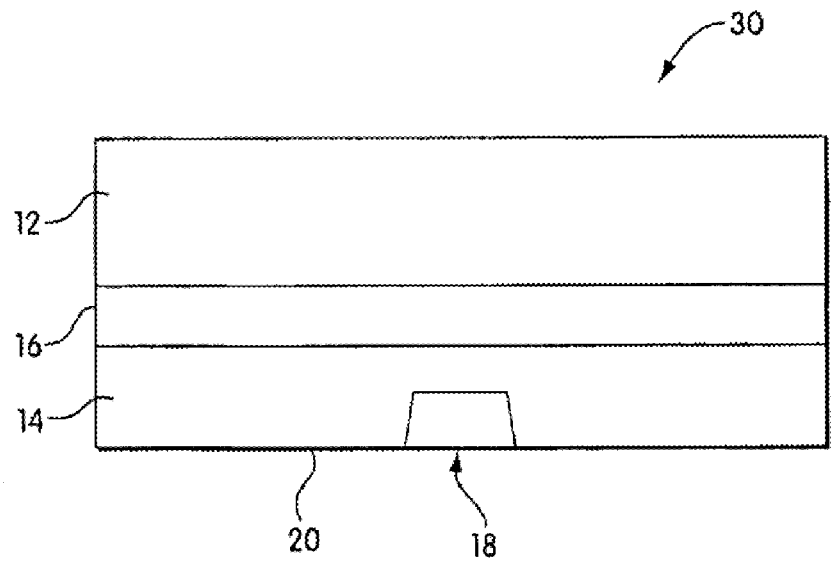
Figure 7:
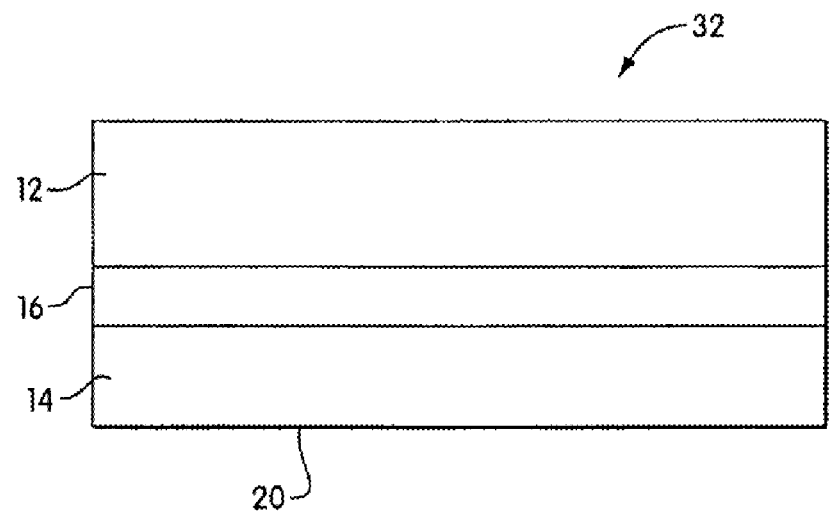
Figure 8:
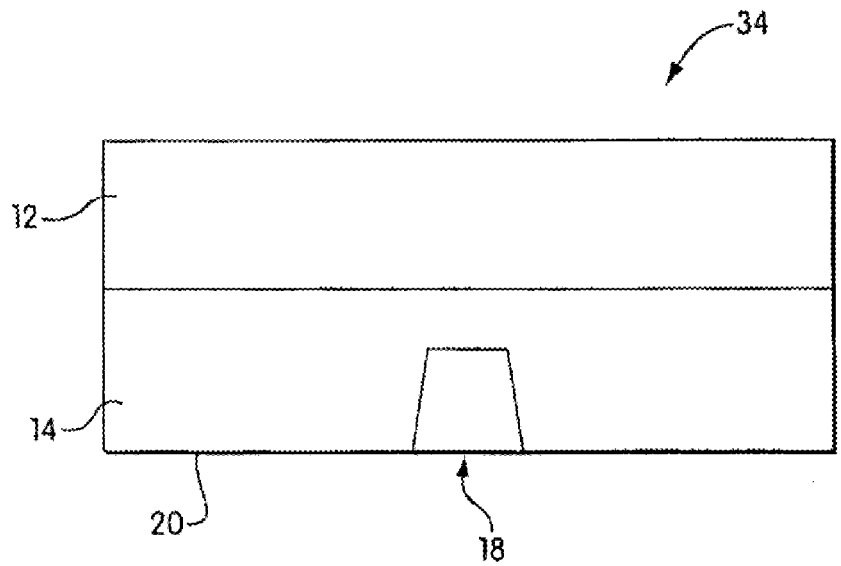
Figure 9:
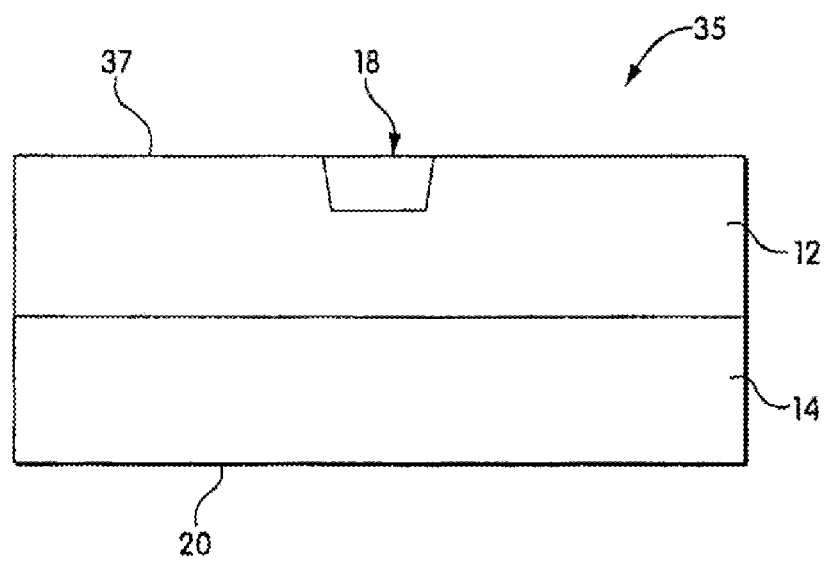
Figure 10:
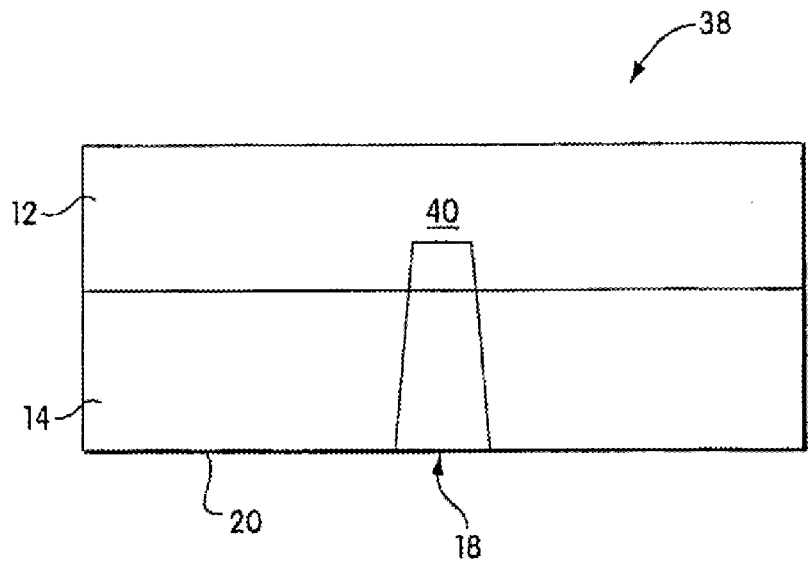
Figure 11:
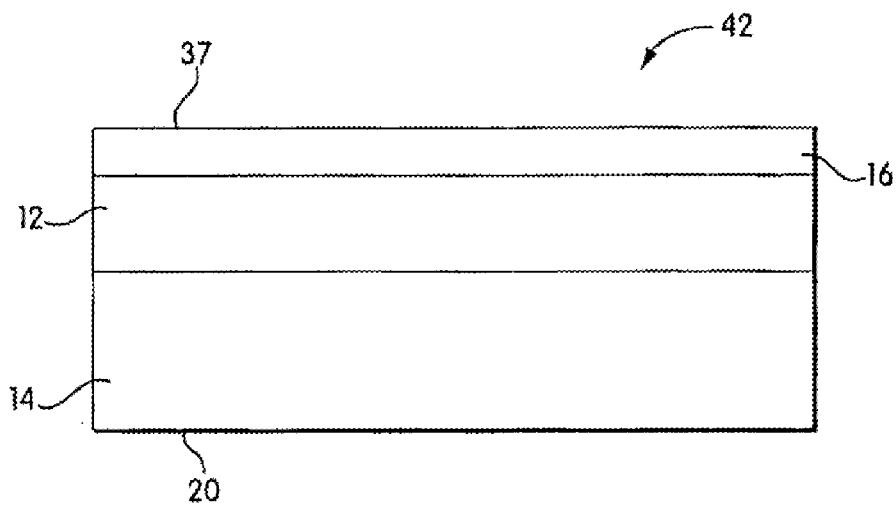

Heat sink 18 may dissipate the heat according to different mechanisms which depend upon the particular design of the heat sink. FIGS. 3 to 5 show different embodiments of heat sink 18.

In the embodiment of FIG. 3, a device 21 has a heat sink 18a including a conductive material 22 deposited within a via 24 that extends from backside 20. Conductive material 22 conducts heat away from device 21 to the environment and/or to a supporting structure (e.g., a platen which may be cooled by water or air) which contacts heat sink 18 during use of device 21. Thus, heat sink 18a removes heat from device 21.

The exact dimensions and shape of via 24 depend upon the application. A typical cross-sectional area diameter of between about 300 and 500 microns at backside 20. It may be preferable for via 24 to be tapered inward away from backside 20, as shown, thus giving the via a cone shape. The inward taper can facilitate deposition of conductive material 22 within via 24. The via may taper, for example, to a diameter between about 25 microns and 75 microns.

Conductive material 22 generally may be any material having sufficient conductivity to prevent excessive heating of device 21. When the device includes both heat sink 18 and spreading layer 16, as shown in FIG. 1, it may be desirable for conductive material 22 to have a greater thermal conductivity than the material that forms the spreading layer to most efficiently dissipate heat from the device. Conductive material 22, for example, has a thermal conductivity of greater than about 3.0 $W/m^2 \cdot K$. In other embodiments, conductive material 22 has a significantly greater thermal conductivity (e.g., greater than about 30 $W/m^2 \cdot K$) which may enable relatively large amounts of heat to be dissipated.

Examples of suitable materials for conductive material 22 include, but are not limited to, copper, gold, polycrystalline diamond, aluminum nitride, silicon carbide, and aluminum gallium nitride alloys having greater than 0.5 mole fraction of aluminum. In some cases, processing considerations may determine, at least in part, the composition of conductive material 22. Metals that can be sputtered, such as copper and gold, may be preferred in certain cases to facilitate deposition into via 24.

In the embodiment of FIG. 4, a device 23 has a heat sink 18b that includes an interface layer 26 deposited on walls of via 24 prior to the deposition of conductive material 22. Interface layer 26 may have a number of functions including: preventing chemical interaction between conductive material 22 and substrate 14; preventing diffusion between the conductive material and the substrate; and, improving the adherence between the conductive material and the substrate. Interface layer 26 is typically also made of a conductive material so as maintain conduction to heat sink 18b. Examples of suitable materials for interface layer 26 are titanium and titanium/tungsten alloys. As shown, interface layer 26 may also be formed to cover backside 20 of the device, for example, for passivation functions.

In the embodiment of FIG. 5, a device 25 has a heat sink 18c formed by a channel 28 that extends laterally across device 25 on backside 20. Channel 28 increases the surface area of backside 20 exposed to the environment which can increase the amount of heat dissipated by heat sink 18. The dimensions of channel 28 depend at least in part upon the cooling requirements and more than one channel may be utilized on the same device. In some embodiments, walls of channel 28 may be coated, for example, with a conductive material. To increase cooling of device 25, a cooling medium may be forced through channel 28. Suitable cooling mediums include gases (e.g., air) or liquids (e.g., liquid He, liquid $N_2$).

In certain preferred embodiments of the invention, substrate 14 is a silicon substrate. Silicon substrates are relatively inexpensive, may be processed using known techniques, and are readily available in a variety of sizes (including large diameters such as 6 inches (150 mm) and 8 inches (200 mm)). A silicon substrate, as used herein, refers to any substrate that includes a silicon layer at its top surface. Examples of suitable silicon substrates include substrates that are composed of bulk silicon (e.g., silicon wafers), silicon-on-insulator (SOI) substrates, silicon-on-sapphire substrates (SOS), and separation by implanted oxygen (SIMOX) substrates, amongst others. High-quality single-crystal silicon substrates are used in many embodiments. Silicon substrates having different crystallographic orientations may be used. In some cases, silicon (111) substrates are preferred. In other cases, silicon (100) substrates are preferred.

It should be understood that in other embodiments, substrates other than silicon substrates may be used such as sapphire and silicon carbide substrates.

The thermal regions of the present invention may be particularly useful when utilizing silicon substrates because silicon has a relatively low thermal conductivity. Thus, silicon substrates generally do not effectively spread or dissipate heat generated in device 10. It should be understood that other types of substrates that have better thermal conductivities than silicon (e.g., silicon carbide) may also benefit from utilizing the thermal regions of the present invention by further enhancing the spreading or dissipation of heat.

Substrate 14 may have any dimensions and its particular dimensions are dictated by the application. Suitable diameters include, but are not limited to, 2 inches (50 mm), 4 inches (100 mm), 6 inches (150 mm), and 8 inches (200 mm). In some embodiments, silicon substrate 14 is relatively thick, for example, greater than 250 microns. Thicker substrates are generally able to resist bending which can occur, in some cases, in thinner substrates. In some embodiments, silicon substrate 14 preferably is thin (e.g., less than 100 microns), for example, to facilitate the formation of via 24 therethrough.

Gallium nitride material device region 12 comprises at least one gallium nitride material layer. In some cases, gallium nitride material device region 12 includes only one gallium nitride material layer. In other cases, gallium nitride material device region 12 includes more than one gallium nitride material layer. When more than one gallium nitride material layer is provided in device region 12, the respective layers may have different compositions and/or contain different dopants. The different layers can form different regions of the semiconductor structure. Gallium nitride material region also may include one or more layers having compositions that are non-gallium nitride materials.

As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_b N_{(1-a-b)}$), aluminum indium gallium arsenide phosporide nitride ($Al_xIn_yGa_{(1-x-y)}As_aP_b N_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in U.S. patent application Ser. No. 09/736,972, incorporated herein.

Gallium nitride material region 12 is generally of high enough quality so as to permit the formation of devices therein. Preferably, gallium nitride material region 12 has a low crack level and a low defect level. In some cases, device 10 may include one or more buffer or transition layers (not shown), including the compositionally-graded transition layer described above, which may reduce crack and/or defect formation. In some embodiments, gallium nitride material region 12 has less than $10^9$ defects/cm$^2$. Gallium nitride materials having low crack levels have been described in U.S. patent application Ser. No. 09/736,972, incorporated herein. In some cases, gallium nitride material region 12 has a crack level of less than 0.005 $\mu m/\mu m^2$. In some cases, gallium nitride material has a very low crack level of less than 0.001 $\mu m/\mu m^2$. In certain cases, it may be preferable for gallium nitride material region 12 to be substantially crack-free as defined by a crack level of less than 0.0001 $\mu m/\mu m^2$.

In certain cases, gallium nitride material region 12 includes a layer or layers which have a monocrystalline structure. In some preferred eases, gallium nitride material region 12 includes one or more layers having a Wurtzite (hexagonal) structure.

The thickness of gallium nitride material device region 12 and the number of different layers are dictated at least in part by the requirements of the specific application. At a minimum, the thickness of gallium nitride material device region 12 is sufficient to permit formation of the desired device. Gallium nitride material device region 12 generally has a thickness of greater than 0.1 micron, though not always. In other cases, gallium nitride material region 12 has a thickness of greater than 0.5 micron, greater than 0.75 micron, greater than 1.0 microns, greater than 2.0 microns, or greater than 5.0 microns.

FIG. 1 illustrates an embodiment in which heat spreading layer 16 is connected to heat sink 18. It should be understood that other embodiments may have other structures.

Figure 6:
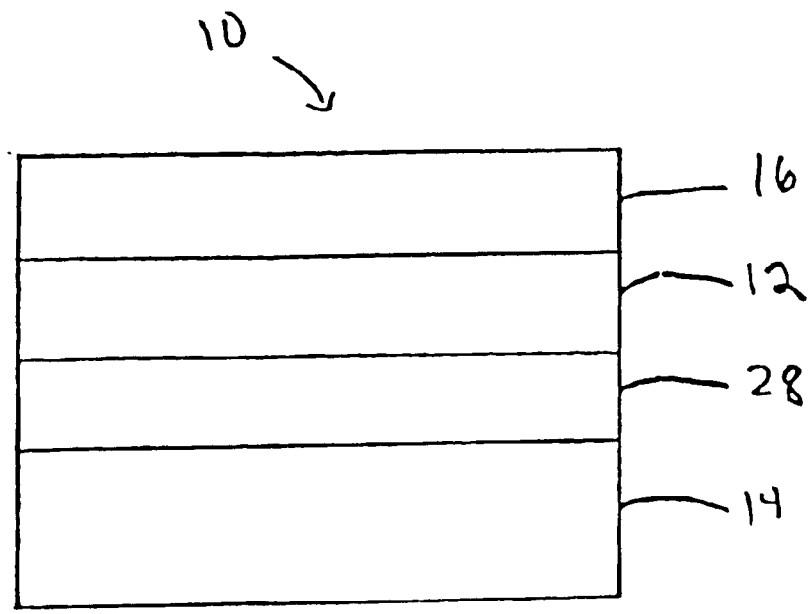
FIG. 6 illustrates a gallium nitride material device that includes a heat spreading layer that is not in direct contact with a heat sink according to one embodiment of the present invention.

As shown in FIG. 6, device 30 includes heat spreading layer 16 that is not in direct contact with heat sink 18. The embodiment of FIG. 6 may provide sufficient heat distribution and dissipation. In some cases, it may be advantageous for heat sink 18 not to extend to spreading layer 16, for example, for processing reasons.

Figure 7:
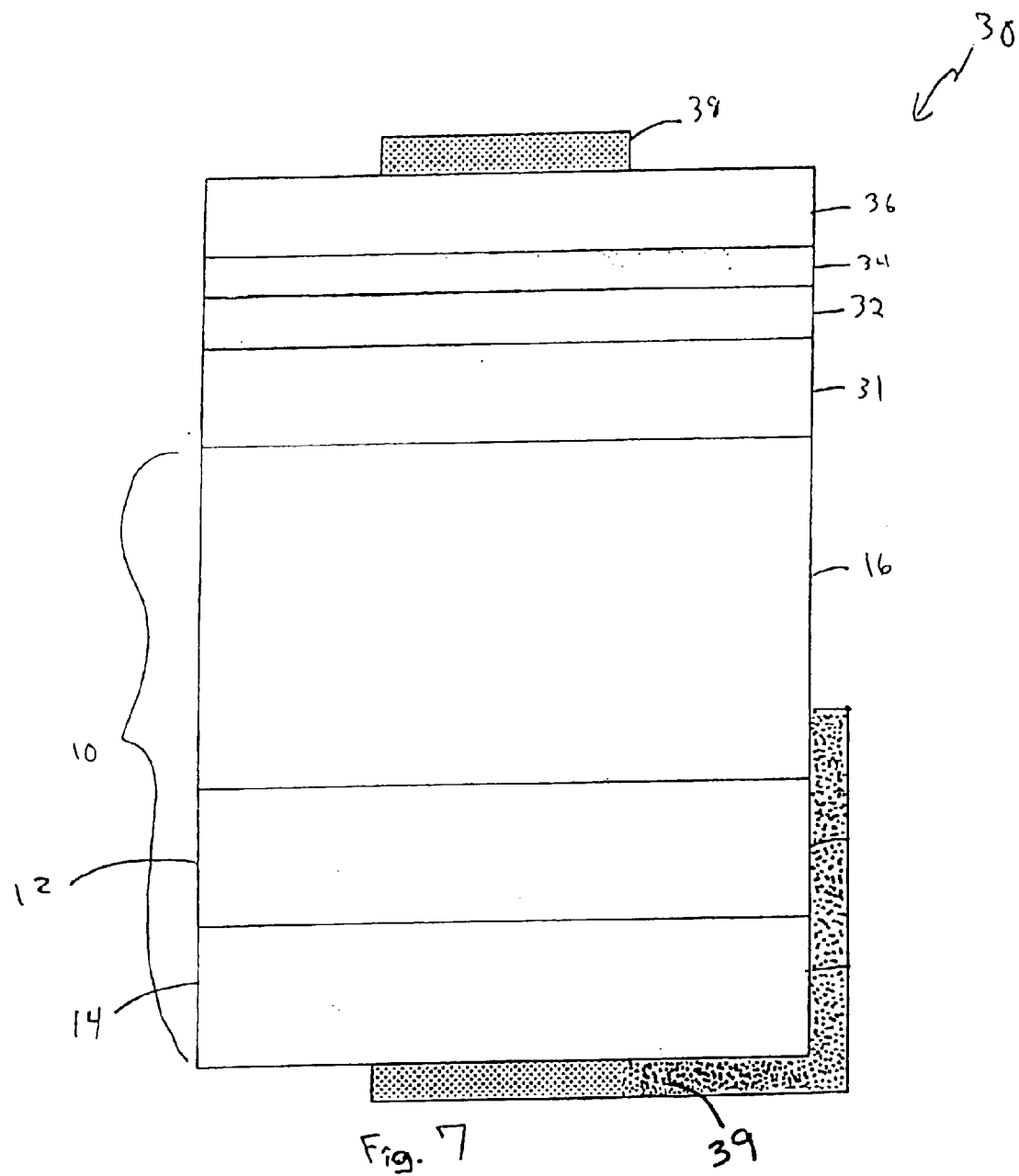
FIG. 7 illustrates a gallium nitride material device that includes a heat spreading layer without a heat sink according to one embodiment of the present invention.

FIG. 7 shows a device 32 that includes a heat spreading layer 16 without a heat sink. Device 32 may be appropriate when heat spreading layer 16 adequately distributes heat, without the need for heat sink 18 to further dissipate heat to the environment or a supporting structure.

Figure 8:
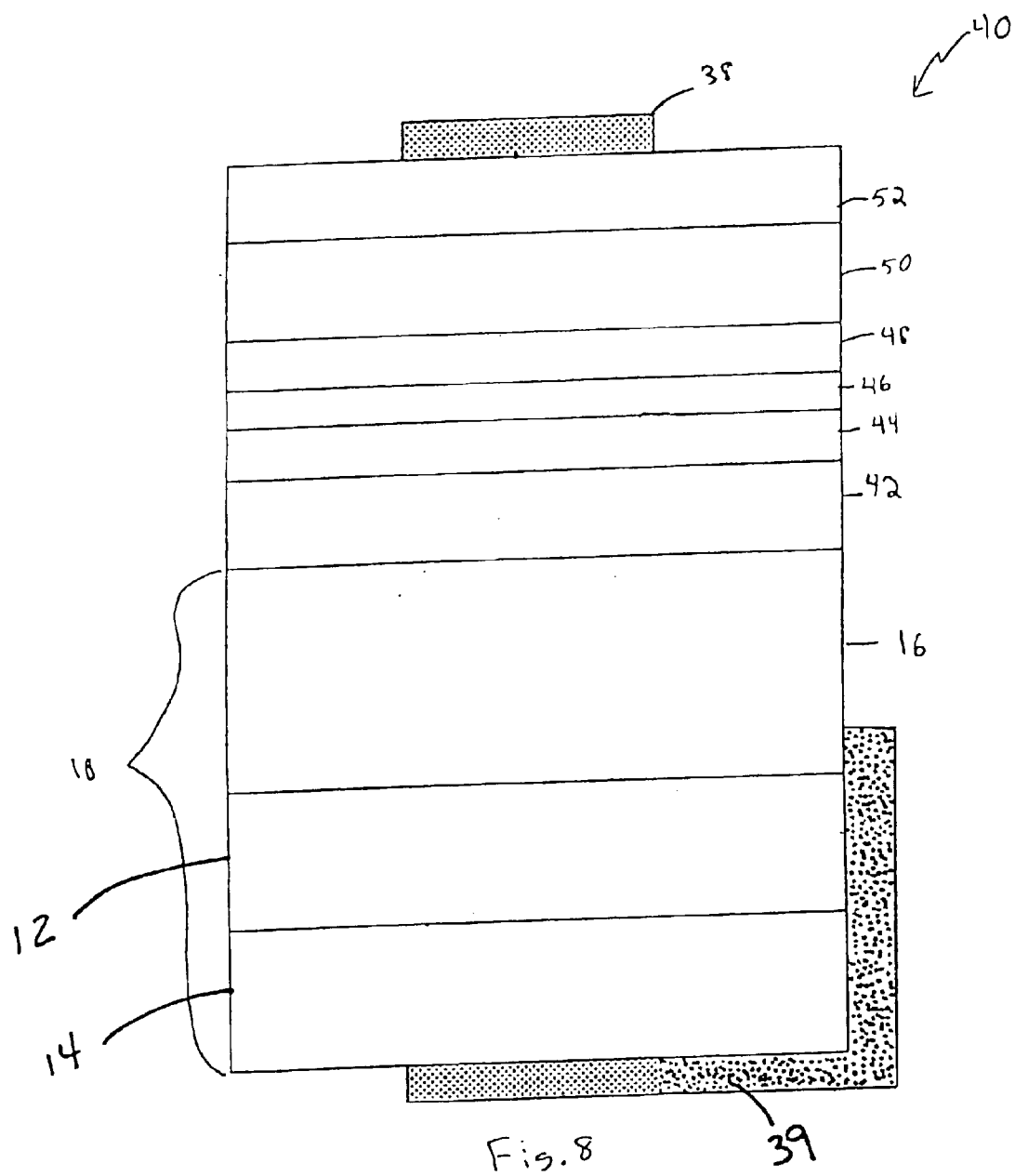
FIG. 8 illustrates a gallium nitride material device that includes a heat sink without a heat spreading layer according to one embodiment of the present invention.

FIG. 8 shows a device 34 that includes a heat sink 18 without a heat spreading layer. Device 34 may be used when heat dissipation within heat sink 18 is required without the need to distribute heat using spreading layer 16.

FIG. 9 illustrates a device 35 that includes a heat sink 18 that extends from a topside 37 of the device. The embodiment of FIG. 9 may be preferred when it is advantageous for heat sink 18 to extend from topside 37 rather than backside 20, for example, for processing reasons.

Figure 10:
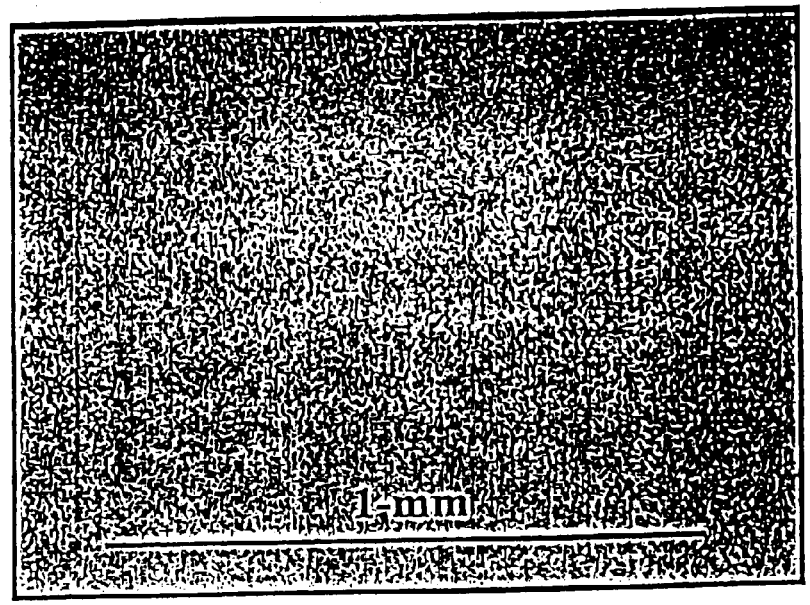
FIG. 10 illustrates a gallium nitride material device that includes a heat sink that directly contacts a heat generation region according to one embodiment of the present invention.

FIG. 10 illustrates a device 38 that includes a heat sink 18 that extends from backside 20 to directly contact a heat generation region 40, for example, within gallium nitride material device region 12. Heat generation region 40, for example, can be an active device area or a highly resistive region. The embodiment of FIG. 10 may facilitate removal of heat from a highly localized region.

Figure 11:
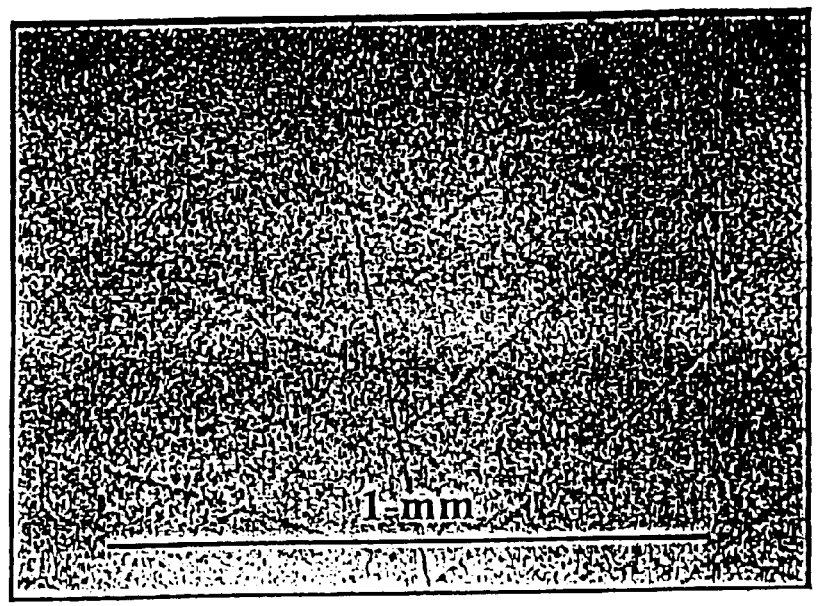
FIG. 11 illustrates a gallium nitride material device that includes a heat spreading layer at a topside of the device according to one embodiment of the present invention.
Figure 1:
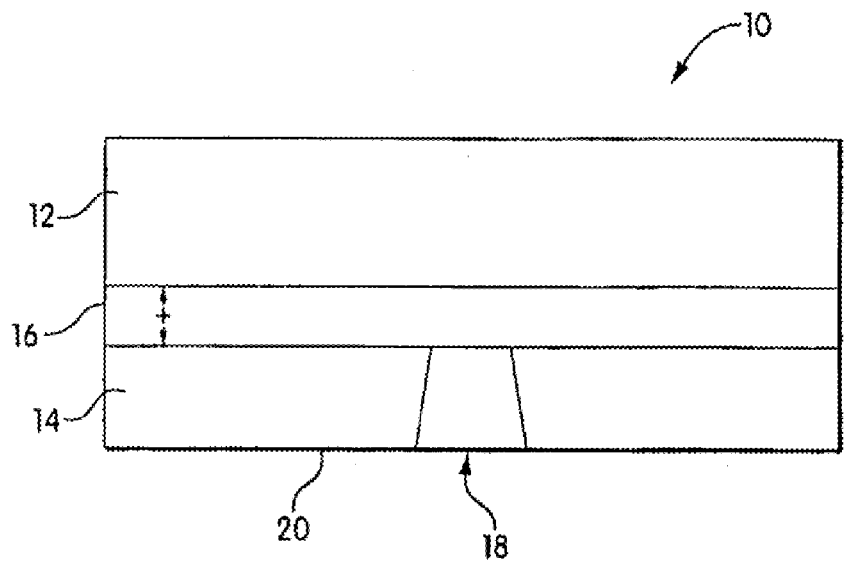

FIG. 11 illustrates a gallium nitride material device 42 that includes a heat spreading layer 16 at a topside 37 of the device. It should also be understood that the heat spreading layer may also be positioned elsewhere in the device including within gallium nitride material device region 12.

Though not illustrated in the figures, the devices of the invention may also include any number of other structures known in the art of semiconductor processing such as electrically insulating regions, doped regions, contact pads, and the like. When present, contact pads may be formed on the device topside, backside, or both. Contact pads are formed of an electrically conductive material and can provide connection to terminals of an appropriate power source through wire bonding, air bridging and the like. In certain cases when composed of a conductive material, heat sink 18 may function as a backside contact pad.

The devices described herein (e.g., device 10) may be any suitable semiconductor device known in the art including electronic and optical devices. In particular, devices that generate significant amounts of heat during operation may utilize advantages of the present invention. Exemplary devices include power generating devices (e.g., power transistor) and optical devices (e.g., high power/ultra-high brightness LEDs and laser diodes). It should be understood that other devices are also possible.

In many cases, the devices may be formed entirely within gallium nitride material region 12 (i.e., the only active device regions are within gallium nitride material region 12). In other cases, the device is formed only in part within gallium nitride material region 12 and is also formed in other regions such as substrate 14.

As described above, the devices described herein can utilize thermal regions (i.e., spreading layer 16 and heat sink 18) to distribute and/or dissipate heat in order to prevent excessive heat generation within device. In other embodiments, the devices (e.g., device 10) may utilize thermal regions (i.e., spreading layer 16 and heat sink 18) to heat and/or cool the device using an external source. For example, device 10 may be heated and/or cooled to maintain a substantially constant temperature within the device. Such external sources may be connected to a feedback system which monitors the temperature of the device and controls the amount of heat and/or cooling provided by the source. Examples of devices which may utilize heating and/or cooling from an external source include pyroelectric devices and piezoelectric devices.

The semiconductor devices of the present invention may be formed using known processing techniques. Heat spreading layer 16 and gallium nitride material device region 12 may be deposited on substrate 14, for example, using metalorganic chemical vapor deposition (MOCVD), molecular beam epitaxy (MBE), hydride vapor phase epitaxy (HVPE), amongst other techniques. In some cases, an MOCVD process may be preferred. For example, a suitable MOCVD process to form gallium nitride material device region 12 on a silicon substrate 14 has been described in U.S. patent application Ser. No. 09/736,972, incorporated herein. When gallium nitride material device region 12 has different layers, in some cases it is preferable to use a single deposition step (e.g., an MOCVD step) to form the entire device region 12. When using the single deposition step, the processing parameters are suitably changed at the appropriate time to form the different layers. In certain preferred cases, a single growth step may be used to form heat spreading layer 15 and gallium nitride material device region 12.

In some cases, it may be preferable to grow device region 12 using a lateral epitaxial overgrowth (LEO) technique that involves growing an underlying gallium nitride layer through mask openings and then laterally over the mask to form the gallium nitride material device region, for example, as described in U.S. Pat. No. 6,051,849, which is incorporated herein by reference. In some cases, it may be preferable to grow device region 12 using a pendeoepitaxial technique that involves growing sidewalls of gallium nitride material posts into trenches until growth from adjacent sidewalls coalesces to form a gallium nitride material region, for example, as described in U.S. Pat. No. 6,177,688, which is incorporated herein by reference.

Conventional etching techniques may be used to form via 24 or channel 28, when present. Suitable techniques include wet chemical etching and plasma etching (i.e., RIE, ICP etching, amongst others). A pre-determined etching time may be used to form via 24 with the desired dimensions. In other cases, an etch stop layer which has a composition that slows or stops etching may be provided within device 10 so that precise control over the etching time is not required to form via 24 with desired dimensions. In some cases, heat spreading layer 16 may function as an etch-stop layer. For example, aluminum nitride heat spreading layers may be effective at slowing or stopping etching techniques used to make via 24 in substrate 14.

Conductive material 22 may be deposited using known techniques suitable for depositing conductive materials such as metals. Such techniques include sputtering, electron beam deposition, evaporation, amongst others.

Those skilled in the art would readily appreciate that all parameters listed herein are meant to be exemplary and that the actual parameters would depend upon the specific application for which the semiconductor materials and methods of the invention are used. It is, therefore, to be understood that the foregoing embodiments are presented by way of example only and that, within the scope of the appended claims and equivalents thereto the invention may be practiced otherwise than as specifically described.

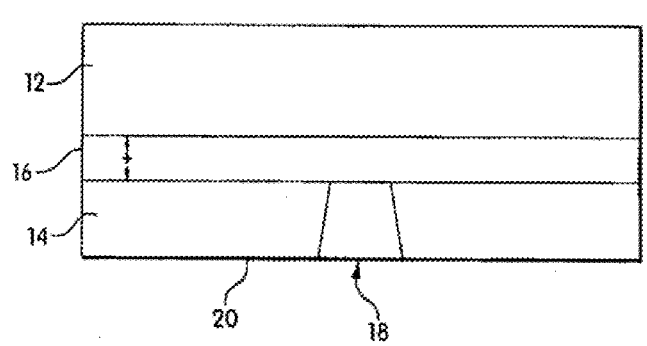

What is claimed is:

1. A semiconductor structure comprising:
   a silicon substrate;
   a gallium nitride material region having a crack level of less than 0.005 micron/micron$^2$ and formed over the substrate;
   a device structure formed, at least in part, in the gallium nitride material region;
   a heat spreading layer formed over the substrate, the heat spreading layer having a graded composition and a greater thermal conductivity than that of the gallium nitride material region and capable of conducting heat generated by the device structure; and
   a heat sink formed in the semiconductor structure.

2. The semiconductor structure of claim 1, wherein the heat spreading layer is formed between the substrate and the gallium nitride material region.

3. The semiconductor structure of claim 1, wherein the heat spreading layer comprises a compound of the group consisting of group III nitrides, alloys of silicon carbide and aluminum nitride, and silicon carbide.

4. The semiconductor structure of claim 1, wherein a portion of the heat spreading layer comprises a compound of the group consisting of aluminum nitride and $Al_xGa_{(1-x)}N$, wherein x>0.5.

5. The semiconductor structure of claim 1, wherein a portion of the heat spreading layer comprises aluminum nitride.

6. The semiconductor structure of claim 1, wherein the compositionally-graded transition layer comprises $Al_xGa_{(1-x)}N$ and x is varied across a thickness of the layer.

7. The semiconductor structure of claim 1, wherein the heat spreading layer has a thermal conductivity greater than or equal to about 1.7 W/m$^2$·K.

8. The semiconductor structure of claim 1, wherein the heat spreading layer has a thermal conductivity greater than or equal to about 4.5 W/m$^2$·K.

9. The semiconductor structure of claim 1, wherein the heat spreading layer has a greater thermal conductivity than that of the substrate.

10. The semiconductor structure of claim 1, wherein the heat spreading layer is in direct contact with the gallium nitride material region.

11. The semiconductor structure of claim 1, wherein the heat spreading layer has a thickness between about 100 nm and about 5 $\mu$m.

12. The semiconductor structure of claim 1, wherein the heat spreading layer comprises an etch stop layer.

13. The semiconductor structure of claim 1, wherein the heat sink extends from a surface of the semiconductor structure.

14. The semiconductor structure of claim 13, wherein the heat sink extends from a backside of the semiconductor structure.

15. The semiconductor structure of claim 13, wherein the heat sink extends from a topside of the semiconductor structure.

16. The semiconductor structure of claim 1, wherein the heat sink extends to a heat generating region within the semiconductor structure.

17. The semiconductor structure of claim 1, wherein the heat sink has a surface exposed to the environment.

18. The semiconductor structure of claim 1, wherein the heat sink is in contact with the heat spreading layer.

19. The semiconductor structure of claim 1, wherein the heat sink comprises a conductive material deposited in a via.

20. The semiconductor structure of claim 19, wherein the conductive material comprises a compound of the group consisting essentially of copper, gold, polycrystalline diamond, aluminum nitride, silicon carbide, and $Al_xGa_{(1-x)}N$ wherein x>0.5.

21. The semiconductor structure of claim 19, wherein the conductive material has a thermal conductivity greater than or equal to about 3.0 W/m$^2$·K.

22. The semiconductor structure of claim 19, wherein the conductive material has a thermal conductivity greater than or equal to about 30 W/m$^2$·K.

23. The semiconductor structure of claim 1, wherein the heat sink comprises a channel.

24. The semiconductor structure of claim 1, wherein the substrate comprises bulk silicon.

25. The semiconductor structure of claim 1, wherein the gallium nitride material region includes a plurality of gallium nitride material layers.

26. The semiconductor structure of claim 1, wherein a heat-generating device is formed, at least in part, in the gallium nitride material region.

27. The semiconductor structure of claim 1, further comprising an external heat source thermally connectable to the heat sink.

28. The semiconductor structure of claim 1, wherein the semiconductor structure forms a transistor.

29. The semiconductor structure of claim 1, further comprising an electrical contact formed on the semiconductor structure.

30. The semiconductor structure of claim 1, wherein the composition of the heat spreading layer is graded discontinuously.

31. The semiconductor structure of claim 1, wherein the concentration of gallium in the heat spreading layer is graded.

32. The semiconductor structure of claim 1, wherein the heat spreading layer comprises an alloy of gallium nitride selected from the group consisting of $Al_xIn_yGa_{(1-x-y)}N$, $In_yGa_{(1-y)}N$, and $Al_xGa_{(1-x)}N$.

33. The semiconductor structure of claim 32, wherein the composition of the heat spreading layer is graded by decreasing the value of x in a direction away from the substrate.

34. The semiconductor structure of claim 33, wherein the composition of the heat spreading layer is graded by decreasing the value of x in a step-wise manner in a direction away from the substrate.

35. The semiconductor structure of claim 1, wherein the heat spreading layer comprises $Al_{Ga(1-x)}N$, wherein x is graded to a value of 1.

36. The semiconductor structure of claim 1, wherein the gallium nitride material region is substantially free of cracks.

37. The semiconductor structure of claim 1, wherein the gallium nitride material layer is monocrystalline.

38. The semiconductor structure of claim 1, wherein the device structure is an active device region.

39. A semiconductor structure comprising:
a substrate;
a gallium nitride material region having a crack level of less than 0.005 micron/micron$^2$ and formed over the substrate; and
a heat spreading layer formed over the substrate, the heat spreading layer having a graded composition and a greater thermal conductivity than that of each of the gallium nitride material region and the substrate.

40. The semiconductor structure of claim 39, wherein the heat spreading layer is formed between the substrate and the gallium nitride material region.

41. The semiconductor structure of claim 39, wherein the heat spreading layer comprises a compound of the group consisting of group III nitrides, alloys of silicon carbide and aluminum nitride, and silicon carbide.

42. The semiconductor structure of claim 39, wherein a portion of the heat spreading layer comprises a compound of the group consisting of aluminum nitride and $Al_xGa_{(1-x)}N$, wherein x>0.5.

43. The semiconductor structure of claim 39, wherein a portion of the heat spreading layer comprises aluminum nitride.

44. The semiconductor structure of claim 39, wherein the heat spreading layer comprises $Al_xGa_{(1-x)}N$ and x is varied across a thickness of the layer.

45. The semiconductor structure of claim 39, wherein the heat spreading layer has a thermal conductivity greater than or equal to about 1.7 W/m$^2$·K.

46. The semiconductor structure of claim 39, wherein the heat spreading layer has a thermal conductivity greater than or equal to about 4.5 W/m$^2$·K.

47. The semiconductor structure of claim 39, wherein the heat spreading layer is in direct contact with the gallium nitride material region.

48. The semiconductor structure of claim 39, wherein the heat spreading layer is in contact with a heat sink formed in the semiconductor structure.

49. The semiconductor structure of claim 39, wherein the heat spreading layer comprises an etch stop layer.

50. The semiconductor structure of claim 39, wherein the substrate comprises a silicon substrate.

51. The semiconductor structure of claim 50, wherein the substrate comprises bulk silicon.

52. The semiconductor structure of claim 39, wherein the gallium nitride material region includes a plurality of gallium nitride material layers.

53. The semiconductor structure of claim 39, wherein the composition of the heat spreading layer is graded discontinuously.

54. The semiconductor structure of claim 39, wherein the concentration of gallium in the heat spreading layer is graded.

55. The semiconductor structure of claim 39, wherein the heat spreading layer comprises an alloy of gallium nitride selected from the group consisting of $Al_xIn_yGa_{(1-x-y)}N$, $In_yGa_{(1-y)}N$, and $Al_xGa_{(1-x)}N$.

56. The semiconductor structure of claim 55, wherein the composition of the heat spreading layer is graded by decreasing the value of x in a direction away from the substrate.

57. The semiconductor structure of claim 56, wherein the composition of the heat spreading layer is graded by decreasing the value of x in a step-wise manner in a direction away from the substrate.

58. The semiconductor structure of claim 39, wherein the heat spreading layer comprises $Al_xGa_{(1-x)}N$, wherein x is graded to a value of 1.

59. The semiconductor structure of claim 39, wherein the gallium nitride material region has a crack level of less than 0.001 micron/micron$^2$.

60. The semiconductor structure of claim 39, wherein the gallium nitride material region is substantially free of cracks.

61. The semiconductor structure of claim 39, wherein the gallium nitride material layer is monocrystalline.

62. The semiconductor structure of claim 39, further comprising an electrical contact formed on the semiconductor structure.

63. The semiconductor structure of claim 39, further comprising a heat sink.

64. The semiconductor structure of claim 39, wherein the heat sink extends from a surface of the semiconductor structure.

65. The semiconductor structure of claim 64, wherein the heat sink extends from a backside of the semiconductor structure.

66. The semiconductor structure of claim 64, wherein the heat sink is in contact with the heat spreading layer.

67. The semiconductor structure of claim 64, wherein the heat sink comprises a conductive material deposited in a via.

68. The semiconductor structure of claim 64, wherein the heat sink comprises a via.

69. The semiconductor structure of claim 39, wherein the semiconductor structure forms a transistor.

70. A method of forming a semiconductor structure comprising:

forming a heat spreading layer having a graded composition over a silicon substrate;

forming a gallium nitride material region having a crack level of less than 0.005 micron/micron$^2$ over the substrate;

forming a device structure, at least in part, in the gallium nitride material region; and forming a heat sink in the semiconductor structure, wherein the heat spreading layer has a greater thermal conductivity than that of the gallium nitride material region and is capable of conducting heat generated by the device structure.

71. The method of claim 70, further comprising etching a via extending from the surface of the semiconductor structure and depositing a conductive material within the via to form the heat sink.

72. The method of claim 70, further comprising etching a channel extending from a surface of the semiconductor structure to form the heat sink.

73. The method of claim 70, further comprising forming an electrical contact on the semiconductor structure.

74. A method of forming a semiconductor structure comprising:

forming a heat spreading layer over a substrate; and forming a gallium nitride material region having a crack level of less than 0.005 micron/micron$^2$ over the substrate, wherein the heat spreading layer has a greater thermal conductivity than that of both the gallium nitride material region and the substrate and the heat spreading layer has a graded composition.

* * * * *

UNITED STATES PATENT AND TRADEMARK OFFICE
CERTIFICATE OF CORRECTION

PATENT NO. : 6,956,250 B2 Page 1 of 8
APPLICATION NO. : 09/792409
DATED : October 18, 2005
INVENTOR(S) : Ricardo Borges et al.

It is certified that error appears in the above-identified patent and that said Letters Patent is hereby corrected as shown below:

The title page should be deleted and substitute therefor the attached title page.

Drawings:
Delete drawing sheets 1-6, and substitute therefor the drawing sheet, consisting of Figs. 1-11 as shown on the attached pages.

Signed and Sealed this

Fifth Day of February, 2008

JON W. DUDAS
*Director of the United States Patent and Trademark Office*

(12) United States Patent
Borges et al.

(10) Patent No.: US 6,956,250 B2
(45) Date of Patent: *Oct. 18, 2005

(54) GALLIUM NITRIDE MATERIALS INCLUDING THERMALLY CONDUCTIVE REGIONS

(75) Inventors: Ricardo Borges, Morrisville, NC (US); Kevin J. Linthicum, Angier, NC (US); T. Warren Weeks, Raleigh, NC (US); Thomas Gehrke, Apex, NC (US)

(73) Assignee: Nitronex Corporation, Raleigh, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 09/792,409

(22) Filed: Feb. 23, 2001

(65) Prior Publication Data
US 2002/0117695 A1 Aug. 29, 2002

(51) Int. Cl.$^7$ .................................. H01L 31/0328
(52) U.S. Cl. ................... 257/189; 257/190; 257/191; 257/103; 257/615
(58) Field of Search .................... 257/276, 279, 257/103, 197, 76, 94, 96, 95, 98–99, 66, 11, 78, 189, 289, 425, 615, 631, 190–191; 438/214, 280, 411, 619

(56) References Cited

U.S. PATENT DOCUMENTS

| | | |
|---|---|---|
| 4,842,699 A | 6/1989 | Hua et al. |
| 4,910,583 A | 3/1990 | Behr et al. |
| 5,122,845 A | 6/1992 | Manabe et al. |
| 5,192,987 A | 3/1993 | Khan et al. |
| 5,200,641 A | 4/1993 | Kosaki |
| 5,239,188 A * | 8/1993 | Takeuchi et al. .......... 257/76 |
| 5,296,395 A | 3/1994 | Khan et al. |
| 5,389,571 A | 2/1995 | Takeuchi et al. |

(Continued)

FOREIGN PATENT DOCUMENTS

| | | |
|---|---|---|
| EP | 0 079 265 | 5/1983 |
| EP | 0 852 416 A1 | 7/1998 |
| EP | 0 951 055 A2 | 10/1999 |
| JP | 59163865 | 9/1994 |
| JP | 10189800 | 7/1998 |
| WO | WO 00/33365 A1 | 6/2000 |
| WO | WO 01/37327 A1 | 5/2001 |
| WO | WO 01/43174 A2 | 6/2001 |
| WO | WO 01/47002 A2 | 6/2001 |
| WO | WO 01/59819 A1 | 8/2001 |

OTHER PUBLICATIONS

Ishikawa, H. et al., "High-Quality GaN on Si Substrate Using AlGaN/AlN Intermediate Layer," *Phys. Stat. Sol. (a)* 176, pp. 599–603 (1999).

*Primary Examiner*—Long Pham
*Assistant Examiner*—Thao X Le
(74) *Attorney, Agent, or Firm*—Wolf, Greenfield & Sacks, P.C.

(57) ABSTRACT

The invention includes providing gallium nitride materials including thermally conductive regions and methods to form such materials. The gallium nitride materials may be used to form semiconductor devices. The thermally conductive regions may include heat spreading layers and heat sinks. Heat spreading layers distribute heat generated during device operation over relatively large areas to prevent excessive localized heating. Heat sinks typically are formed at either the backside or topside of the device and facilitate heat dissipation to the environment. It may be preferable for devices to include a heat spreading layer which is connected to a heat sink at the backside of the device. A variety of semiconductor devices may utilize features of the invention including devices on silicon substrates and devices which generate large amounts of heat such as power transistors.

74 Claims, 10 Drawing Sheets